United States Patent [19]
Tanaka et al.

[11] Patent Number: 5,492,229
[45] Date of Patent: Feb. 20, 1996

[54] VERTICAL BOAT AND A METHOD FOR MAKING THE SAME

[75] Inventors: Takashi Tanaka, Hadano; Jun Yoshikawa, Sagamihara; Eiichi Toya; Atsuo Kitazawa, both of Nishiokitama; Kazunori Meguro, Oomiya; Tatsuo Nozawa, Nishiokitama; Yutaka Ishizuka, Okitama; Yoshiyuki Watanabe, Nishiokitama; Masaru Seino, Okitama; Hideo Nakanishi, Minamiashigara, all of Japan

[73] Assignee: Toshiba Ceramics Co., Ltd., Tokyo, Japan

[21] Appl. No.: 151,386

[22] Filed: Nov. 12, 1993

[30] Foreign Application Priority Data

Nov. 27, 1992 [JP] Japan .................................. 4-339553
Nov. 30, 1992 [JP] Japan .................................. 4-341060

[51] Int. Cl.$^6$ ........................................... A47F 7/00
[52] U.S. Cl. ............................. 211/41; 206/454; 432/258
[58] Field of Search .................... 211/41, 40, 71; 432/258, 121; 206/454

[56] References Cited

U.S. PATENT DOCUMENTS

| | | |
|---|---|---|
| 4,153,164 | 5/1979 | Hofmeister et al. ............... 211/41 |
| 4,407,654 | 10/1983 | Irwin ............................... 432/258 |
| 4,412,812 | 11/1983 | Sadowski et al. .................. 432/121 |
| 5,219,079 | 6/1993 | Nakamura .......................... 211/41 |

FOREIGN PATENT DOCUMENTS 62-128633  8/1987  Japan.
WO92/06342  4/1992  WIPO.

*Primary Examiner*—Robert W. Gibson, Jr.
*Attorney, Agent, or Firm*—Foley & Lardner

[57] ABSTRACT

A vertical boat for holding a plurality of semiconductor wafers comprising two end members (2) positioned at the top and the bottom of the vertical boat, and a plurality of support members (3,4,5,6,104) vertically mounted on the end members (2) for supporting the wafers, wherein each support member (3,4,5,6,104) is formed by a plate-like member having a series of slits (9,10,7,8,108) formed thereon in such a manner that a plurality of support arms are defined by the slits (9,10,7,8,108) at a predetermined interval, each support arm having a support projection (11,12,13,14,112) formed at the end thereof, and wherein the inner portions (P) of the wafer (1) is to be supported by the support projections (11,12,13,14,112) whereas the periphery of the wafer (1) does not contact the arms of the support members (3,4,5,6,104). The slits can be formed in two steps: forming a series of first slit portions on the plate-like member at a predetermined interval so as to retain two side walls of the plate-like member; and forming a series of second small slit portions on one of the side walls at the same interval so as to connect each second slit portion to the corresponding first slit portion.

18 Claims, 7 Drawing Sheets

FIG. 1
FIG. 2
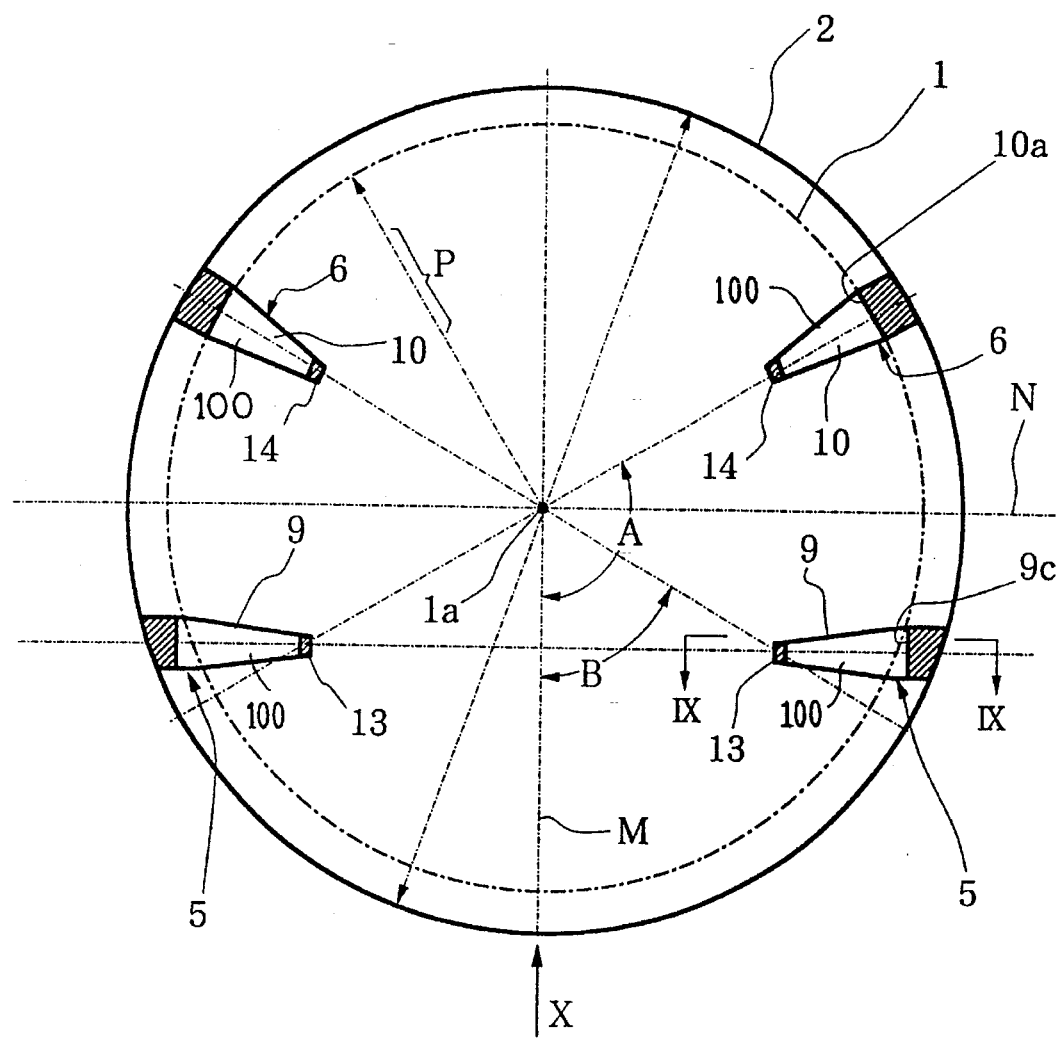
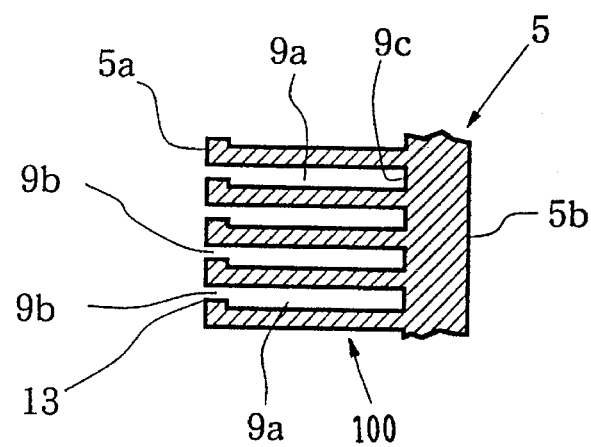

VERTICAL BOAT AND A METHOD FOR MAKING THE SAME

BACKGROUND OF THE INVENTION

The invention relates to a vertical boat for holding a plurality of semiconductor wafers and a method for making the same, which comprises two end members and a plurality of support members vertically mounted on the end members.

In an oxidation and/or a diffusion process, a wafer boat supporting a plurality of semiconductor wafers is transferred into a diffusion furnace, and the wafers are subjected to a predetermined heat treatment.

Either a vertical boat or a horizontal boat is selected according to the type of the diffusion furnace.

A conventional vertical boat has two end plates and a plurality of, for example four, vertical support bar members fixed between and to the end plates. A plurality of wafers are held in a horizontal or somewhat inclined manner on the vertical boat. A plurality of slits are formed on each vertical support member at a predetermined interval for receiving the semiconductor wafers.

In the conventional vertical boat, all vertical support members usually have a uniform configuration in cross section. The vertical support member is, for instance, a triangle bar or a rectangle bar. Each slit formed on each vertical support member has an arc-shaped inner bottom corresponding to the periphery of the wafer. Thus, a support surface formed on each slit has only a small extension in the circumferential direction of the wafer.

On the other hand, Japanese Utility Model laid open No. 62-128633 discloses a boat which comprises circular arc plates fixed on support bars, wherein the loading stress of the large wafer can be somewhat relaxed. However this boat is expensive because the circular arc plates must have a very accurate surface on which the wafer is to be placed.

During heat treatments not only wafers but also the boat, regardless of its shape, is heated to a high temperature. The larger the wafer is, the more it is apt to be deflected by its own weight when heated to such a high temperature. It is because the wafer is supported only at its peripheral portion by the conventional vertical boat. Thus the wafer is apt to be deformed and sometimes slipped, and a crystal dislocation therein is caused. Consequently the yield will go down. The term "slip" is used in reference to a crystal defect or a crystal dislocation.

On the other hand, the load of the wafers is not equally distributed among the vertical support members. In other words the load is concentrated to a specific support member or members. As a result, the larger the wafer is, the more frequently slips take place.

In the above-stated conventional boat, two front vertical support members located on the wafer inserting side are spaced somewhat larger than the outer diameter of the wafer for forming a space between the two front vertical support members large enough to insert and to take out the wafers. When the wafers are properly loaded on the vertical support members, the angle between a line linking a front edge of the front vertical support members to the gravity center of the wafers and the wafer inserting direction is about 90 degrees. In such a position, the gravity center of the wafer is approximately located between the front edges of the two front vertical support members so that the load of the wafers is biased on the two front vertical support members. As a result the two front vertical support members share, for example, 70–90% of the weight of the wafers.

There is also a thermal stress resulting from a temperature difference between the wafers and the slit portions of the vertical support member engaging the wafers.

Therefore the larger the wafers are, more frequently slip dislocations are caused.

When the wafers are subjected to a heat treatment, heat is transferred to the wafers not only by radiation from the diffusion furnace but also by direct heat transfer from the slit portions of the vertical support members engaging with the wafers. The latter, particularly, results in a partial temperature difference on each wafer. Stress caused on the wafer not only by its own weight but also by the temperature difference leads to slip dislocation of the wafers especially near the two front vertical support members. As a result, during heat treatments, the yield of wafers will go down.

SUMMARY OF THE INVENTION

An object of the present invention is to provide a vertical boat wherein no slip dislocation is caused and the deflection of the wafers is considerably decreased even when large wafers are held thereon.

According to the present invention, a vertical boat for holding a plurality of semiconductor wafers comprises two end members positioned at the top and the bottom of the vertical boat, and a plurality of support members vertically fixed to the end members for supporting the wafers, wherein each support member is a plate-like member having a series of slits formed thereon in such a manner that a plurality of support arms are defined by the slits at a predetermined interval, each support arm having a support projection formed at the end thereof, and wherein the inner portion of each wafer is to be supported by the support projection whereas the periphery of the wafer does not contact the support arms of the support members.

Each slit extends over preferably ⅔ of the width of the support member or more, and preferably it extends over ¾ of the width of the support member or more.

The inner portions of the wafer are supported by the support projections and are preferably concentric about the center of the wafer. And the inner portions are preferably spaced from the center of the wafer by 50–90%, more preferably 65–85%, of the radius of the wafer.

The inner portions of the wafers are preferably positioned in such a manner that the load of the wafers are almost equally distributed among the support members.

The section modulus of each support member is preferably 0.3–3.0, more preferably 0.5–2.5, cubic centimeters.

According to the invention, deflection and curvature of the wafer is considerably decreased, and slip is effectively inhibited. Therefore when the wafers held on the boat are subjected to a heat treatment, quality of the wafers and the yield thereof can be improved, and the time required for the heat treatment can be decreased.

According to the present invention, the support projections support the wafers not at the periphery portions thereof but at the inner portions thereof so that the periphery portion of each of the wafers does not engage with the support members. As a result, the load concentration on any specific support member can be decreased. It is because when the wafer is placed properly on the boat, the gravity center of the wafer can be properly positioned so as to be substantially equally spaced from all support members. In other words, the load of the wafer can be almost equally distributed among all support members. Therefore slip dislocation of the wafer is effectively inhibited.

According to the invention, deflection of the wafer by its own gravity is decreased, because the support projects support the wafer not at the peripheral portions thereof but at the inner portions thereof. Consequently crystal dislocation in the wafer can be inhibited even if the wafer is large, which in the prior art is caused by deformation or stress of the wafer. As a result the yield is improved.

According to this invention, temperature differences and heat stress on each wafer can be effectively decreased, which are mainly caused by direct heat transfer from the peripheral portion of the wafer engaging with the support members in the prior art. It is because the support members support the wafers at the small inner portions thereof, while the peripheral portions of the wafer do not engage the support members. Therefore crystal dislocation in the wafers can be more effectively inhibited, and the yield is further improved.

According to the present invention, a process for producing a vertical boat comprises the steps of forming a series of first slit portions on a plate-like member at a predetermined interval in such a manner that two longitudinal side walls of the plate-like member remain, and forming a series of second slit portions on one of the longitudinal side walls at the same interval in such a manner that the first and the second slit portions are connected to each other so as to define a series of arms each having a small support projection at an end thereof near the center axis of the vertical boat.

The plate-like member is, for example, a plane plate, a pipe, a pipe-like plate and so on. The plate-like member can have a J-shaped, a U-shaped, a C-shaped, an L-shaped, or a V-shaped cross section. In case of an L-shaped or a V-shaped cross section, a corner angle of the plate-like member is arranged to, for example, 45–150 degrees.

According to the invention, a vertical boat having very accurate slits can be produced. The width and the interval of the slits can be formed with high accuracy.

BRIEF DESCRIPTION OF THE DRAWINGS

Embodiments of the present invention will now be described, by way of example only, with reference to the accompanying drawings of which:

FIG. 1 is a schematic sectional view showing a first embodiment of a vertical boat according to the present invention;

FIG. 2 is a sectional view showing one of the support members of the vertical boat of FIG. 1;

FIGS. 6A and 6B are views showing a process of producing one of the support members of FIG. 3, wherein FIG. 6A shows a left side of the support members of FIG. 6B and FIG. 6B shows a section taken along lines IV—IV of FIG. 6A;

FIGS. 7A and 7B are views showing one of the support members of FIG. 3, wherein FIG. 7A shows a left side of the support members of FIG. 7B and FIG. 7B shows a section taken along lines V—V of FIG. 7A;

FIGS. 8A and 8B are views showing a process of producing the other support member of FIG. 3, wherein FIG. 8A shows a left side of the support members of FIG. 8B and FIG. 8B shows a section taken along lines VI—VI of FIG. 8A;

FIGS. 9A and 9B are views showing the other support member of FIG. 3, wherein FIG. 9A shows a left side of the support member of FIG. 9B and FIG. 9B shows a section taken long lines V—V of FIG. 9A;

DESCRIPTION OF THE PREFERRED EMBODIMENTS

Figure 3:
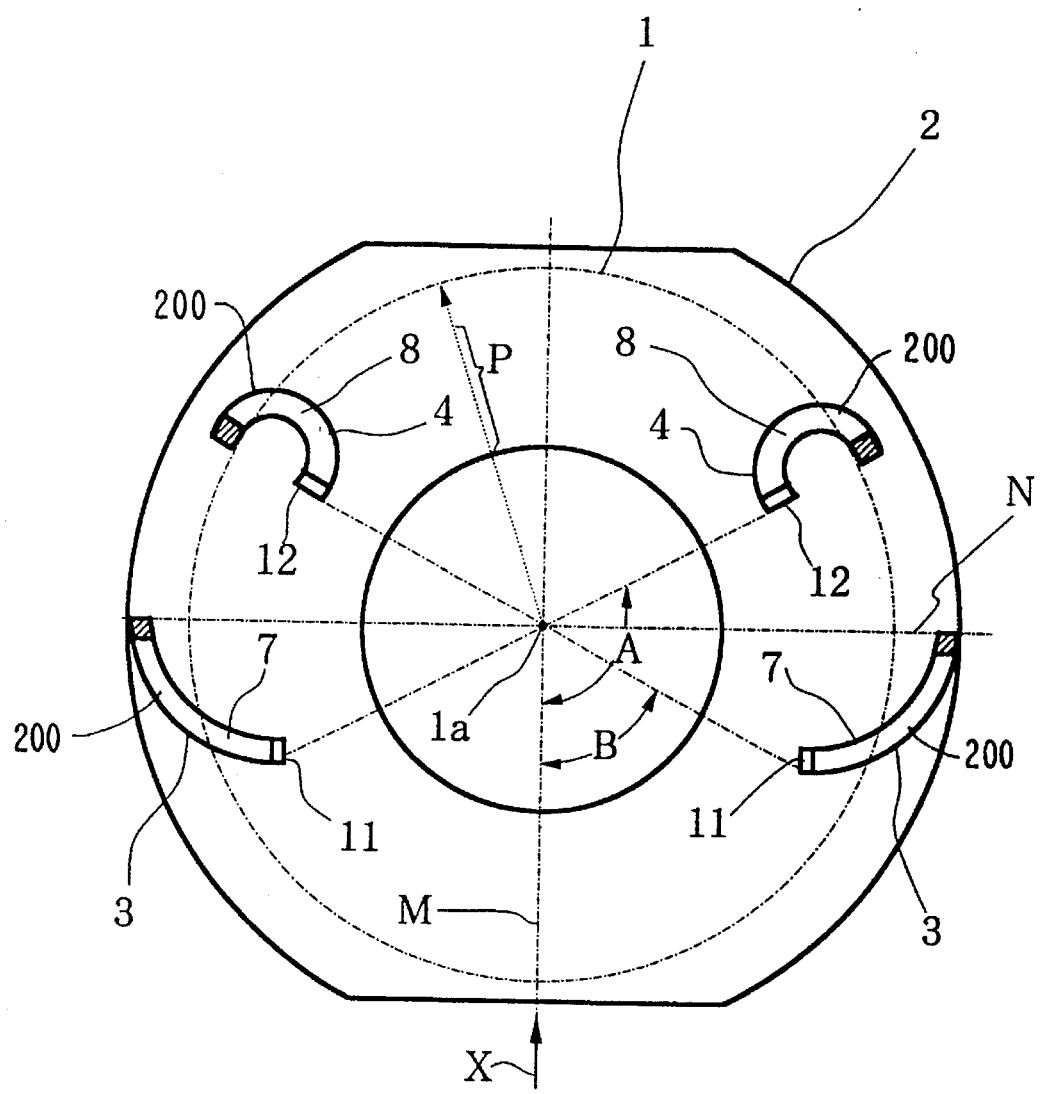
FIG. 3 is a schematic sectional view, taken along lines I—I in FIG. 4, showing a second embodiment of the present invention.

FIGS. 1 and 2 show a first embodiment of a vertical boat according to the present invention. The vertical boat for holding a plurality of wafers 1 comprises two end plates 2 located at the top and the bottom of the boat, and three or more, normally four, support members 5, 6 are mounted vertically between and to the end plates 2. Only the bottom end plate 2 is shown in FIG. 1. Each of the support members 5, 6 is generally a plate whose cross section is a long rectangle. A series of slits 9, 10 for receiving the wafers 1 are formed on each support member 5, 6.

The slits 9, 10 extend over ⅔ or more, preferably ¾ or more, of the width of the support members 5, 6. By the slits 9, 10 a plurality of arms 100 for supporting the wafers 1 are defined as shown in FIG. 2, which extend horizontally and are parallel to one another. A small support projection 13, 14 is formed at the end of each arm 100 in such a manner that the support projections 13, 14 support the wafer 1 at the inner portions P thereof, whereas the arms 100 extend over the peripheral portion of the wafer in non-contact manner. The inner portions P of the wafer 1 to be supported by the support projections 13, 14 are preferably ranged or spaced from the center 1a of the wafer 1 by 50–90% of the radius of the wafer 1. And the inner portions P of the wafer 1 are preferably arranged in a concentric manner around the center 1a of the wafer 1 as shown in FIGS. 1 and 2.

The peripheral portions of the wafer 1 never contact the support projections 13, 14 of the arms 100 so that the heat does not transfer directly via the peripheral portion of the wafer 1 from the support members 5, 6 to the wafer 1. Also, stress concentration on the peripheral portion of the wafer 1 is decreased.

The height of each support projection 13, 14 is preferably 0.3–3 mm so as to ensure proper gas circulation. The width of each slit 9, 10 is large enough to restrain heat transfer from the boat to the wafers and to prevent gas from stagnating between the wafer and the arm 100.

The vertical boat may be made of silica glass, silicon carbide, carbon, monocrystal silicon, polycrystal silicon, silicon carbide impregnated with silicon and so on, which preferably has a high purity, a large heat resistance and a large corrosion resistance. In the case of silica glass, welding is convenient for connecting the members, while in the other cases they may be assembled in a predetermined manner.

Two types of support members 5, 6 are used in this embodiment, and they are vertically mounted and fixed to the end members 2 parallel to each other.

The support members 5,6 have different lengths and different widths in cross section. Two front support members 5 are located on the wafer inserting side and are formed in the shape of a relatively thin plate. The cross section of the plate 5 has generally a wedge-shape. The slits 9 are formed at predetermined intervals on the support member 5 as shown in FIG. 2. The slits 9 are parallel to each other and extend over approximately 4/5 of the width of the support member 5. A plurality of arms 100 are defined by the slits 9 so that the support member 5 looks like a comb. Each slit 9 has a first slit portion 9a and a second slit portion 9a and a second slit portion 9b as shown in FIG. 2. The first slit portion 9a is longer and wider than the second slit portion 9b. A small support projection 13 is formed at the end of each arm 100. The support projection 13 has relatively a small area, for instance, 12 square millimeters. Two support members 5,5 are positioned so as to face each other.

The other two support members 6, 6 at the rear side are formed in the shape of a thicker plate in comparison with the support member 5. The cross section of the plate 6 has generally a wedge-shape. The slits 10 are formed at predetermined intervals on the support members 6,6 in a similar manner in the support member 5. The slits 10 are parallel to each other and extend over approximately 3/4 of the width of the support member 6. A plurality of arms 100 are defined by the slits 10 so that the support member 6 looks like a comb. The slits 10 are formed in a similar manner in the slit 9. A support projection 14 is also formed at the end of each arm 100. The support projection 14 has relatively a small area, for instance, 12 square millimeters. The support members 6,6 are positioned so as to face the center 1a of the wafer 1.

The wafer 1 is supported by the support members 5,6 in such a manner that the inner portion P of the wafer 1 is supported by the support projections 13,14, whereas the periphery portion of the wafer never contacts the arms 100 of the support member 5,6 and the support projections 13,14.

The slit 9 of the front support member 5 is so formed that the slit bottom 9c is parallel to the wafer inserting direction X. The slits 10 of the rear support member 6 are so formed that the slit bottom 10a thereof is parallel to the tangent line of the circumscribing circle of the wafer 1.

When the wafer 1 is placed properly in the boat, the support projections 9,10 support the wafer not at the peripheral portion thereof but at the inner portion P thereof. The support portion P is preferably concentric around the center 1a of the wafer 1, and spaced from the center 1a of the wafer 1 by 50%–90%, preferably 65%–85%, of the radius of the wafer 1.

The support portions P of the wafer 1 to be supported by the support projections 13,14 are arranged or distributed in a circumferential direction in such a manner that the angle between a line linking the support projection 14 of the rear support member 6 to the center 1a of the wafer 1 and the wafer inserting direction X is 75–180 degrees, preferably 95–140 degrees. The angle defined by a line linking the support projection 13 of the front support member 5 to the center 1a of the wafer 1 and the inserting direction X is 30–120 degrees, preferably 30–80 degrees.

The support projections 13,14 can be arranged in any other manner. For example, the two projections 13,13 of the front support members 9,9 and the two projections 14,14 of the rear support members 10,10 may be positioned so as to be symmetric relative to lines M and N as shown in FIG. 1. The line M passes through the center 1a of the wafer 1 and is parallel to the wafer inserting direction X. The line N passes through the center 1a of the wafer 1 and is perpendicular to the wafer inserting direction X. In this manner the load of the wafer 1 is distributed equally among the four support projections 13,14 so that the wafer 1 can be supported in a good balanced manner. The wafer 1 is placed on the boat in such a manner that the center 1a of the wafer approximately coincides with the center line of the vertical boat.

The support members 5,6 can be produced in the following manner. First, a plate member 5 or 6 is prepared, whose cross section has generally a wedge-shape as shown in FIG. 1. Then a series of first slit portions 9a, of which size is for example 29×5.35 mm, are formed on the plate member 9 or 10 between two sides thereof at a predetermined interval, for example 3 mm, by water jet, for example. A plurality of windows are formed in series along a longitudinal direction of the plate member 5 and side walls 5a,5b are retained. One side wall 5b is, for example, two or three times thicker than the other side wall 5a.

Next, second slit portions 9b are formed on the thin side wall 5a at predetermined intervals, for example 3 mm, by a diamond cutter. The second slit portion 9b has a small width and is connected to the corresponding first slit portion 9b. A series of arms 100 each having a support projection 13 or 14 at the end thereof are defined by the first and the second slit portions 9a,9b. The arms 100 horizontally protrude from the thick side wall 5b so that the thick side wall 5b acts as a support column. The support projection 13 or 14 is, for example, 1 mm in height and has a small top surface for supporting the inner portions P of the wafer 1. Thus comb-shaped support members 9, 10 as shown in FIG. 2 are formed.

After the first slit portions are formed on the plate members, the plate members can be fixed on one or two end members. After that the second slit portions can be formed on the plate members. By this method, the slits can be formed with good accuracy.

After the first slit portions are formed on the plate members, the plates can be impregnated with Si and then the second slits can be formed. In this manner, the second slit portions can be easily machined.

When the slits are formed on the support members in said manner, the slits can be formed with high accuracy because the cut volume is very small in the second step.

FIGS. 3–9 and FIG. 10 show second and third embodiments of the vertical boat according to the present invention, respectively. The vertical boat, in each case, comprises two end plates located on the top and the bottom of the boat, and three or more, normally four, support members 3,4,104 vertically mounted on the end plates. Each support member 3,4,104 has a series of slits 7,8,108 at predetermined intervals along a longitudinal direction thereof. Each support member 3,4,104 is generally a long plate or a long plate-like member.

The slits 7,8,108 extend over 2/3 or more, preferably 3/4 or more, of the width of the support members 3,4,104. By the slits 7,8,108 a series of arms 200 are defined on the support members 3,4,104. Each arm 200 has support projections 11,12,112 at the end thereof in such a manner that the support projections 11,12,112 support the inner portion P of the wafer 1, while the arms 200 extend over the periphery of the wafer in non-contact manner. Said inner portion P of the wafer 1 to be supported by the support projections 11,12,112 is preferably concentric about the center 1a of the wafer 1, and preferably spaced or arranged from the center 1a of the wafer 1 by 50%–90% of the radius of the wafer 1.

In the second embodiment each support member 3,4 has an arc or circular arc cross section. The cross section of the support member can be in an L-shape, a J-shape, a boomerang-shape or other curved-shape. The support members 3,4 can be formed by longitudinally cut pipe. The support member 104 is generally a pipe in the third embodiment. The thickness of each support member 3,4 104 is constant over its full length, but it can be decreased gradually toward their ends. The support members can be modified in various forms, and the structure of the support members is not restricted to the illustrated embodiments.

The peripheral portions of the wafer never contact the support projections 11,12,112 of the support members 3,4, 104 so that heat does not transfer via the peripheral portions from the support members to the wafers. The weight concentration on the peripheral portion of the wafer is decreased.

The height of each support projection 11,12,112 can be selected such that the periphery of the wafer does not contact the arms 200 of the support members 3,4,104. It is preferably 0.3–3 mm for ensuring proper gas circulation. The slits have a relatively large size so that the heat transfer from the boat to the wafer is restrained and gas is prevented from stagnating between the wafer and the arms.

The support projections 11,12,112 are preferably positioned in such a manner that the load of the wafer 1 is equally distributed among all the support members 3,4, 104 and the deflection of each wafer 1 is considerably decreased.

Further the second and third embodiments will be explained hereinafter.

Figure 4:
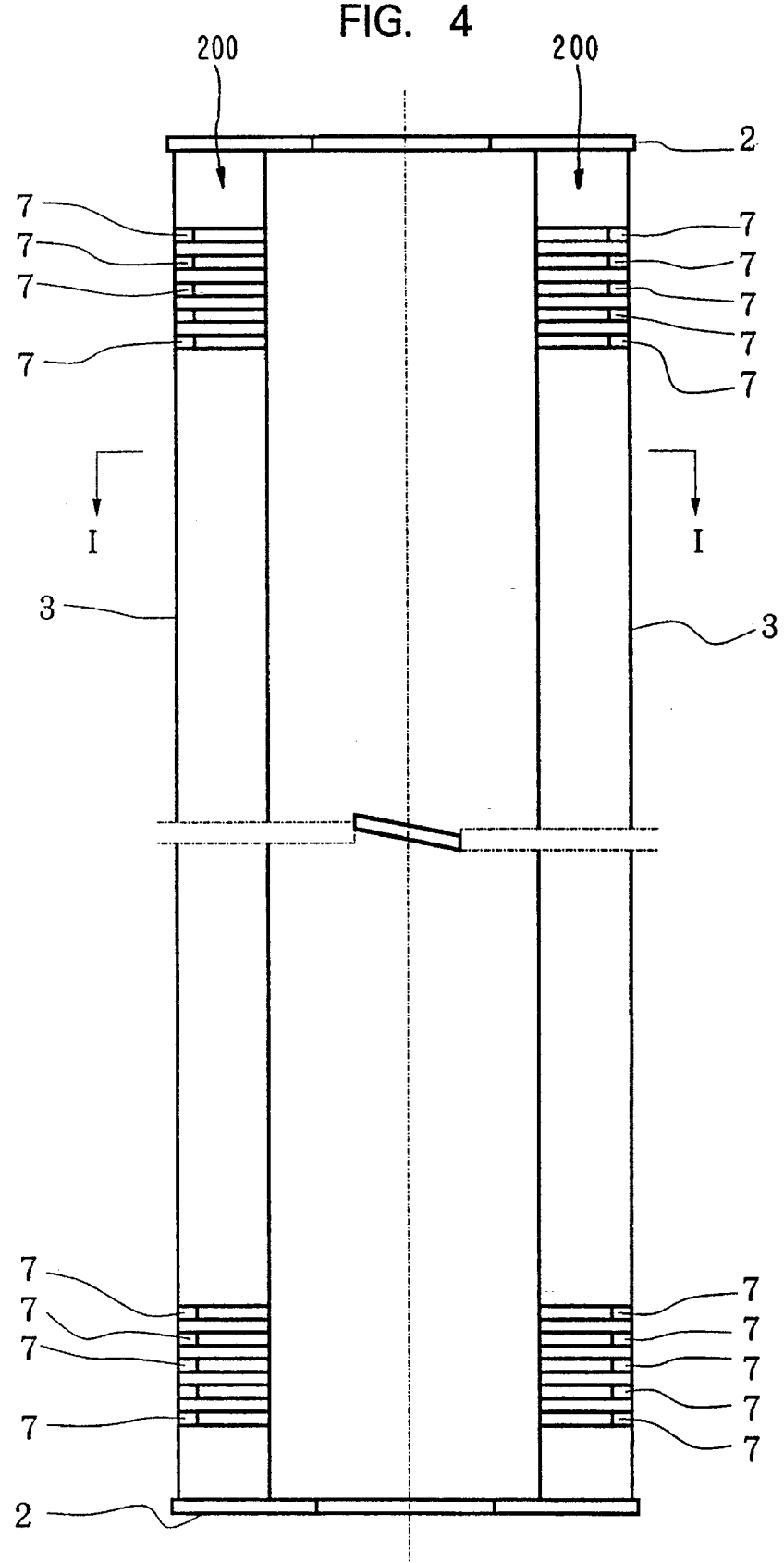
FIG. 4 is a schematic front view showing the vertical boat of FIG. 3, wherein slits on the upper and lower portions thereof are illustrated but slits on the middle portion thereof are omitted.
Figure 5:
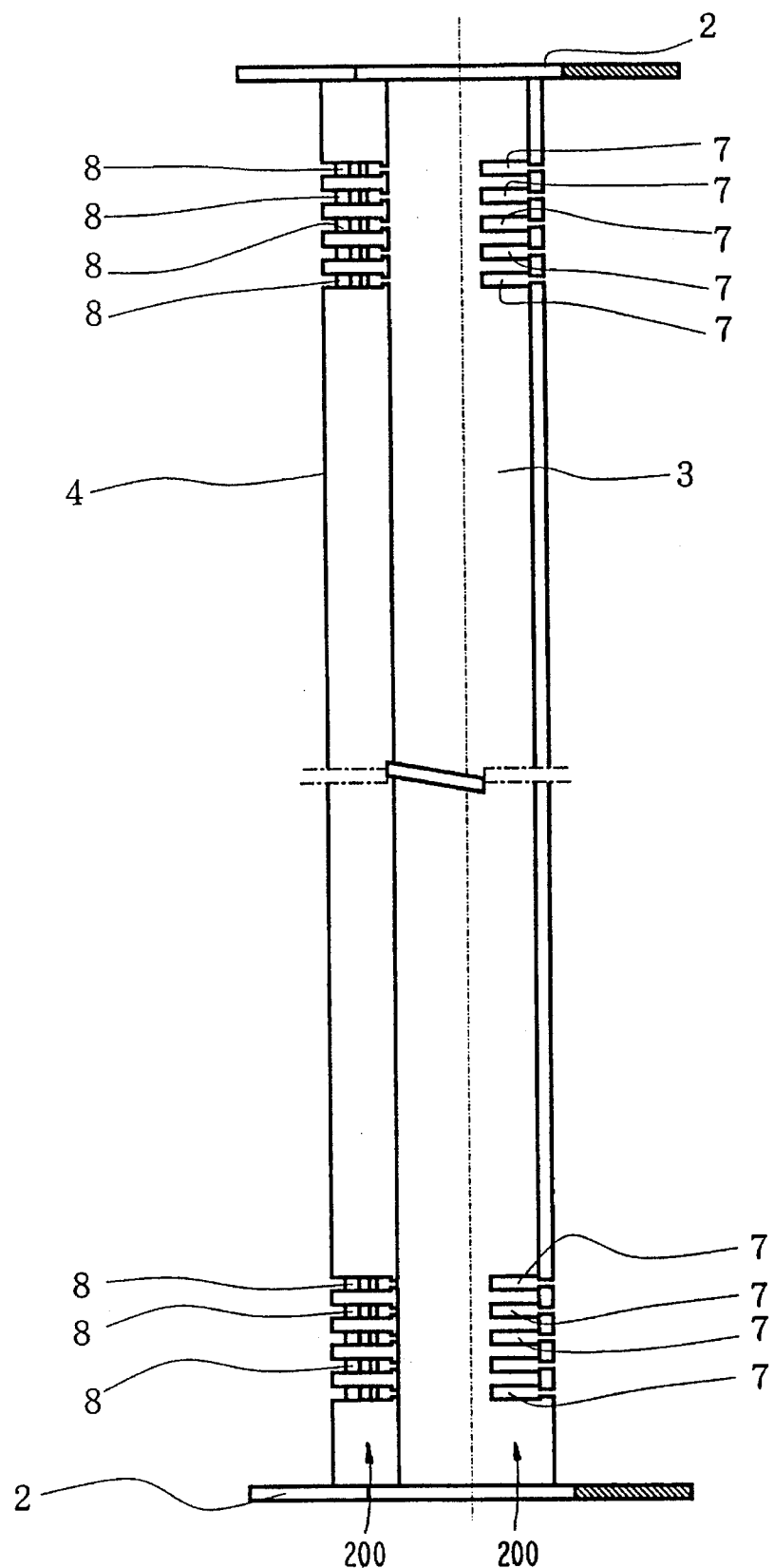
FIG. 5 is a left side view showing the vertical boat of FIG. 3, wherein slits on the middle portion thereof are omitted.

In the second embodiment shown in FIGS. 3–9 the vertical boat has two kinds of support members 3,4. The support members 3,4 are generally semi-circular arc plates having different radii of curvature. Two front support members 3,3 are located near the wafer inserting side and faces each other. The radius of curvature of the support member 3 is larger than that of the support member 4. The support member 3 has a plurality of slits 7 at an interval D1 as shown in FIGS. 4 and 5. The slits 7 extend over about ⅘ of the width of the support member 3. A plurality of arms 200 are defined by the slits 7. Each arm 200 has at its end a small support projection 11. The support projection 11 has at its top a small support surface, the area of which is for example 10–150 square millimeters. The support projection 11 is formed so as to support the inner portion P of the wafer 1, whereas the other portions of the arm 200 do not contact the periphery of the wafer 1.

Figure 6:
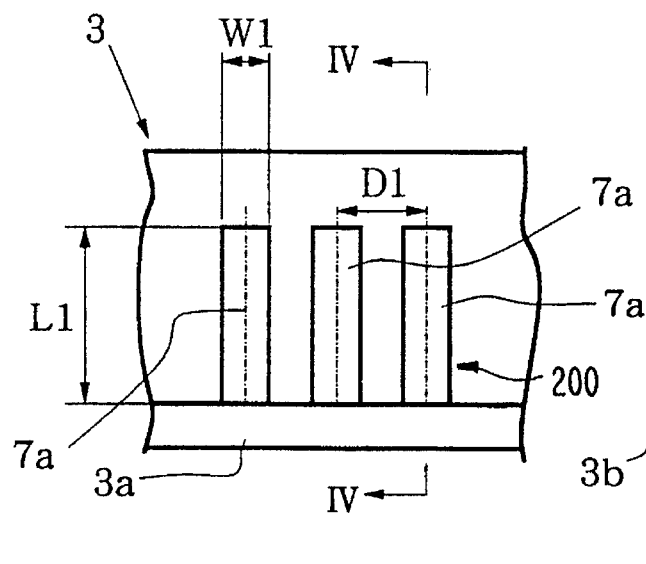
Figure 6:
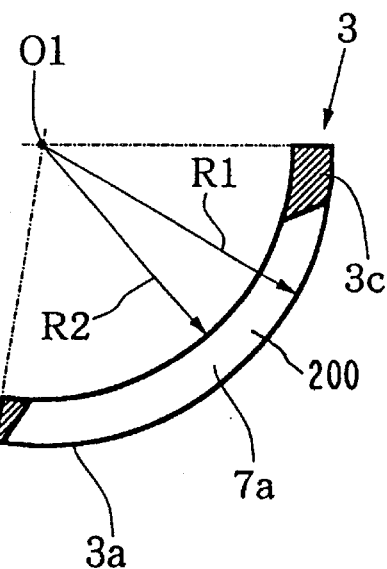
Figure 7:
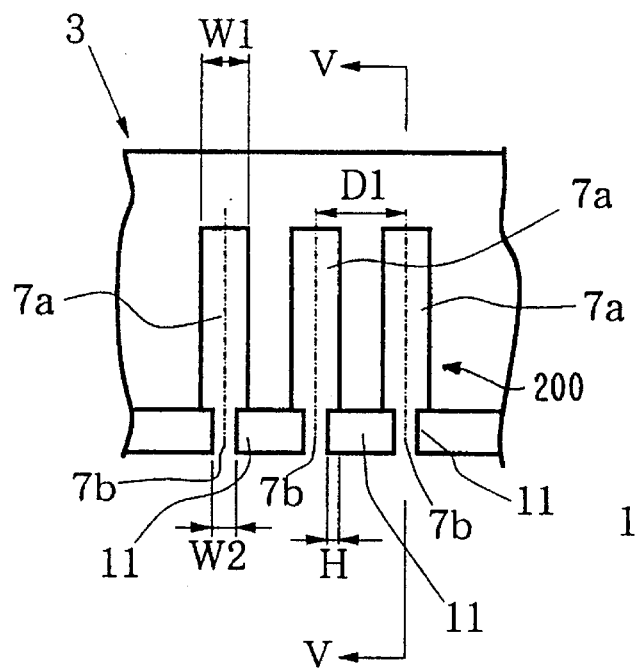
Figure 7:
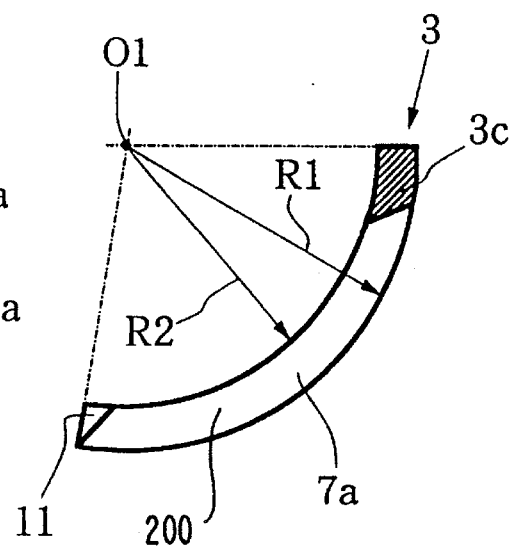
Figure 8:
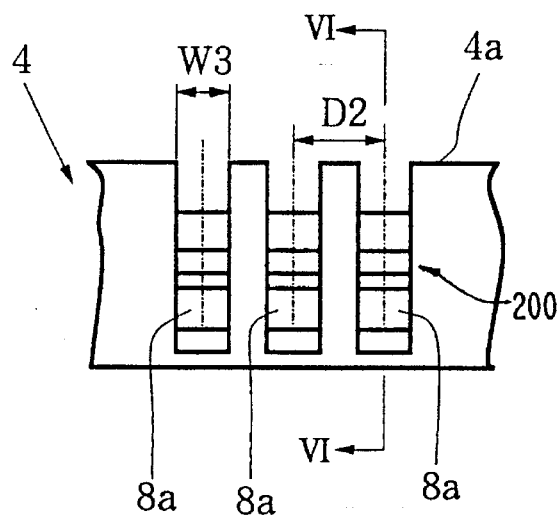
Figure 8:
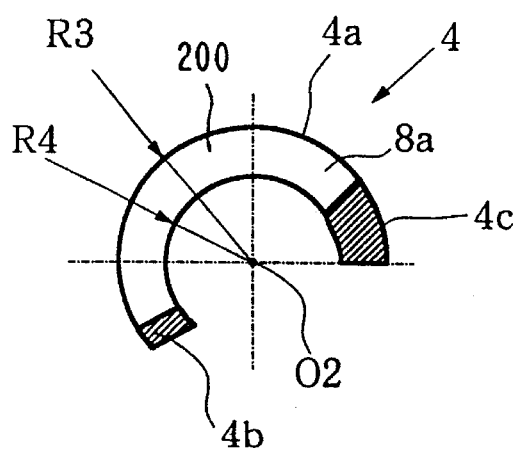
Figure 9:
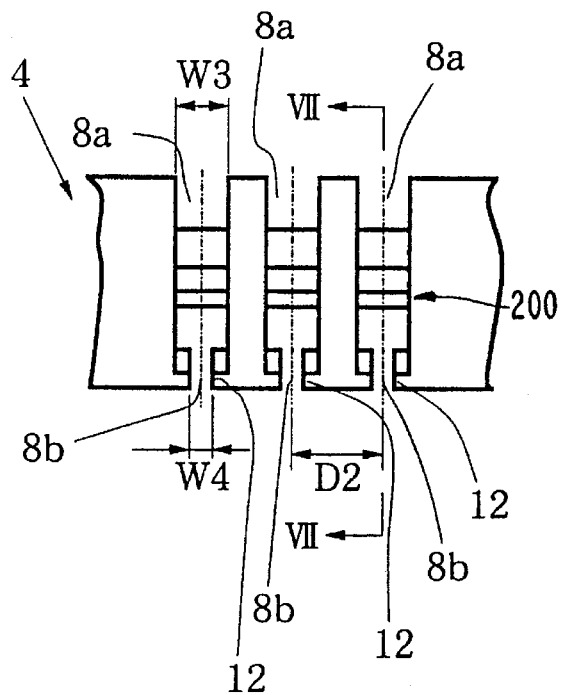
Figure 9:
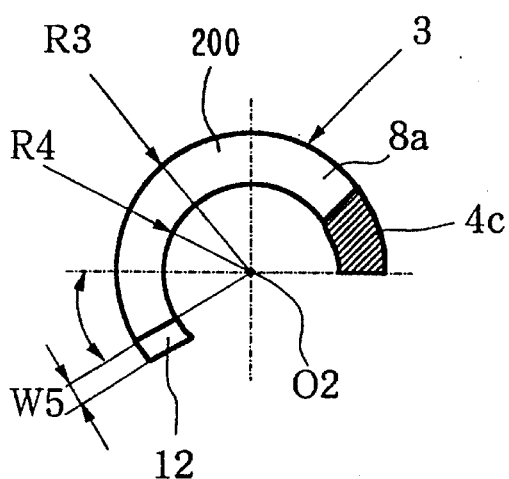

Other support members 4,4 are located on the rear side and have relatively small radii of curvature. The support member 4 has a plurality of slits 8 at a predetermined interval D2 as shown in FIGS. 6 and 7. The slits 8 extend over about ⅘ of the width of the support member 4. A plurality of arms 200 are defined by the slits 8. Each arm 200 has at its end a small support projection 12. The support projection 12 has at its top a small support surface, the area of which is for example 10–50 square millimeters. The support projection 12 is formed so as to support the inner portion P of the wafer 1, whereas the other portions of the arms 200 do not contact the periphery of the wafer 1.

The slit 7 is formed by a first long slit portion 7a with relatively a large width and a second short slit portion 7b with relatively a small width. The slit 8 is also formed by a first long slit portion 8a with relatively a large width and a second short slit portion 8b with relatively a small width.

The inner portion P of the wafer 1 to be supported by the support projections 11,12 is preferably located concentric about the center 1a of the wafer 1, and is preferably arranged or spaced from the center 1a of the wafer 1 by 50–90%, more preferably 65–85%, of the radius of the wafer 1. Therefore the periphery portion of the wafer 1 is not supported by the support projections 11,12.

The support projections 11,12 are preferably distributed in a circumferential direction in such a manner that the angle A between the wafer inserting direction X and a line linking the support projection 12 of the rear support member 4 to the center 1a of the wafer 1 is 75–180 degrees, more preferably 95–140 degrees. On the other hand the angle B between the wafer inserting direction X and a line linking the support projection 11 of the front support member 3 to the center 1a of the wafer 1 is preferably 30–120 degrees, more preferably 30–80 degrees.

The support projections 11,12 can be distributed in any other manner. For example, the two projections 11,11 of the front support members 3,3 and the two projections 12,12 of the rear support members 4,4 can be symmetrical with respect to the line M and the line N shown in FIG. 3. The line M passes through the center 1a of the wafer 1 and is parallel to the wafer inserting direction X, while the line N passes through the center 1a of the wafer 1 and is perpendicular to the wafer inserting direction X. In this manner the load of the wafer 1 is distributed equally among four support projections 11,12 whereby the wafer 1 can be supported in a good balanced manner.

The support member 3 of the second embodiment shown in FIGS. 3–9 can be produced in the following manner. First a pipe member having a relatively large diameter is vertically cut so as to provide a long plate member having a cross section in the shape of an approximately quarter-circular arc. The pipe member has, for example, an outer radius R1 of 40 mm and an inner radius R2 of 34 mm. The long plate member extends circumferentially over, for example, 100 degrees around the center 01 in cross section.

Next a series of first slit portions 7a are formed at the interval D1, for example 12.7 mm, on the plate member. The first slit portions 7a have a width of W1, for example 7 mm, and extend circumferentially over 60–80 degrees around the center 01, which corresponds to the length L1 in FIG. 4. The length L1 is for example 30 mm. The first slit portion can be formed by a laser beam machine, a high pressure jet, a milling cutter, a lather, a diamond cutter and so on. Both longitudinal side walls 3b,3c are retained as shown in FIGS. 6A and 6B. The side wall 3c is thicker than the other side wall 3b so as to act as a column. The thinner wall 3b extends circumferentially over several degrees around the center 01.

Further, a series of second slit portions 7b are formed on the side wall 3b by a diamond cutter. The second slit 7b has a width W2 of 3.2 mm, for example. The second slit portion 7b is cut from the outer surface 3b so as to be connected to the corresponding first slit portion 7a. A series of arms 200 each having a support projection 11 at the end thereof are defined by the first slit portions 7a and the second slit portions 7b as shown in FIGS. 7A and 7B. The support projection 11 has a height of H, for example 1.9 mm, and has a small support surface.

The other support member 4 in FIGS. 3–9 can be produced in the following manner. First a pipe member having a relatively small diameter is vertically cut so as to provide a long plate member having a cross section of a semicircular arc. For example, the pipe member has an outer radius R3 of 17.5 mm and an inner radius R4 of 10 mm. And the long plate member extends circumferentially over, for example, 225 degrees around the center 02 in cross section.

Next a series of first slit portions 8a are formed at the interval D2, for example 12.7 mm, corresponding to the interval D1 of the slit 7 on the plate member 3. The first slit portions 8a have a width of W3, for example 7 mm, and extends circumferentially over 180 degrees around the center 01. The first slit portion can be formed by a laser beam machine, a high pressure jet, a milling cutter, a lather, a diamond cutter and so on. Both vertical side walls 4b,4c are retained as shown in FIGS. 8A and 8B. The side wall 4c is thicker than the other side wall 4b so as to act as a column. The thin wall 4b extends circumferentially over 20 degrees around the center 02, while the thick wall 4c extends over 40 degrees.

A series of second slit portions 8b are formed at intervals D2, for example 12.7 mm, on the side wall 4b by a diamond cutter. The second slit portion 8b has for instance a width W4 of 3.2 mm. The second slit portion 8b is cut from the outer surface 4a so as to be connected to the corresponding first slit portion 8a. A series of arms 200 each having a support projection 12 at the end thereof are defined by the first slit portions 8a and the second slit portions 8b as shown in FIGS. 9A and 9B. The support projection 12 has, for example a height of 1.9 mm, and a width W5 of 3 mm.

Four support members 3,4 and the slits 7,8 are symmetrical with respect to the plane including the central axis of the boat and parallel to the wafer inserting direction X. However they can be positioned in other manners.

Figure 10:
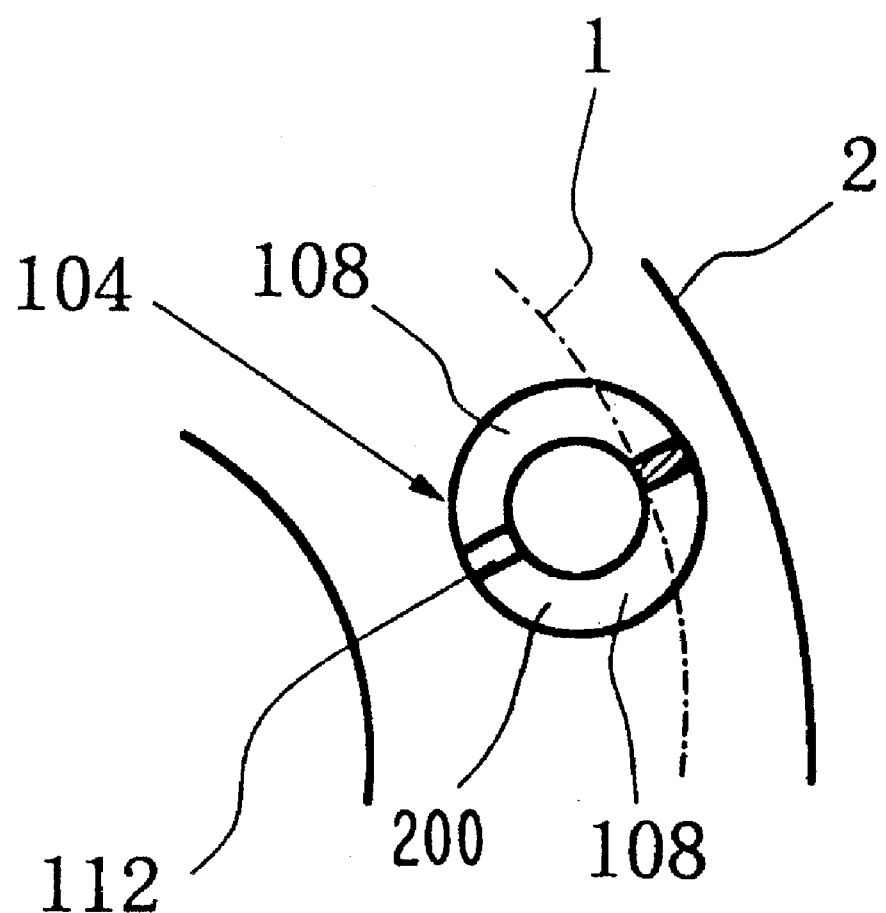
FIG. 10 is a schematic sectional view showing partially a third embodiment of the present invention.

FIG. 10 shows the third embodiment of the present invention. Four pipe-shaped support members 104 are vertically mounted on two end members 2 located at the top and the bottom of the vertical boat. Two front support members 104 are located on the wafer inserting side and have a relatively large diameter for forming a space large enough to insert and to take out the wafers, whereas two rear support members 104 are located on the rear side and have a relatively small diameter for realizing a light-weight construction. However all support members 104 can have the same diameter. On the other hand, the thickness of the support members can be varied by taking into account mechanical strength. In any case section modulus of the support member 104 is preferably 0.3–3.0 cubic centimeter, more preferably 0.52.5 cubic centimeter.

The support members 104 have a series of slits 108 formed at the same interval. The slit 108 can be formed in the following manner. First two series of first slit portions are formed at the same interval from both sides on the pipe member 5. The first slit portion extends over ⅔ and ¾ of the diameter of the pipe member 5 in the front and the rear support members, respectively. Two side walls are retained.

Next a series of second slit portions are formed on one of the walls at the same interval as the first slit portions by a diamond cutter. Each second slit portion is connected to the corresponding first slit portion. The second slit portion has a smaller width than the first slit portion. The second slit portion has a width of 3.2 mm, for example. A series of arms 200 each having a support projection 112 formed at the end portion near the central axis of the vertical boat are defined by the first and second slit portions.

The support projection 112 has a small support surface formed at the top thereof. It has the area of for example 5–50 square millimeters. The wafer is supported in such a manner that the inner portion of the wafer is supported by the support projections 112 whereas the periphery of the wafer does not contact the arms defined by the slits 108. The inner portion of the wafer is preferably positioned about the center 1a of the wafer 1 and arranged or spaced from the center 1a by 50–90% of the radius of the wafer so that the periphery of the wafer is not supported by the support projections 112 of the arms.

The circumferential positioning manner of the support projections 112 is the same as that of the support projections 11,12 of the second embodiment.

In producing the support members 3,4,104, after the first slit portions are formed on the plate-like members, all plate members can be fixed on one of or both of the end members and then the second slit portions can be formed on the plate-like members. In this method, the slits can be formed with good accuracy.

On the other hand after the first slit portions are formed on the plate-like members, the plate-like members can be impregnated with Si and then the second slits can be formed. In this manner, the second slit portions can be easily machined.

EXAMPLE

A vertical boat for 8-inch wafers was formed from monocrystal silicon. The boat had the same construction as the boat shown in FIGS. 3–9. Also, a conventional vertical boat having four support members was prepared for comparative tests.

A value of deflection of the wafer was calculated by a computer-assisted simulation and actual values were detected by a laser micrometer in cases of the boat of this invention and the conventional boat, respectively. The test results are shown in Table 1. As shown in Table 1, the wafer held on the conventional boat was deflected by 30 microns or more, whereas the wafer held on the boat of the invention was deflected by 5 microns or less. Thus in the invention, the deflection of the wafer was much smaller than that in the prior art.

Next values of curvature during a heat treatment were detected. The results are shown in Table 2. The heat treatment was an oxidation process at the temperature of 1000 degrees celsius for 100 hours. Values of curvature were detected by a laser micrometer.

Also, the number of the slips and the length thereof caused during heat treatments (1)–(3) were detected. The results are shown in Table 3. The heat treatments (1)–(3) were carried out according to Table 4.

As shown in Tables 2,3, in case of the invention, the curvature was smaller than that in the prior art. In this invention, slips rarely occurred.

Thus, by using a vertical boat according to the present invention, deflection and curvature of the wafer was decreased, and slip was effectively inhibited during heat treatments. It is mainly because the inner portions of the wafer were supported by the support projections of the arms whereas the periphery portion of the wafer did not contact the arms of the support members.

TABLE 1

|  | the prior art | the present invention |
| --- | --- | --- |
| computer-assisted simulation | 30–180 microns | 5 microns |
| laser micrometer | 150 microns | less than 5 microns |

TABLE 2

| the prior art | the present invention |
| --- | --- |
| 500 microns | less than 5 microns |

TABLE 3

| | number of wafers | number of wafers having slips | length of the slip |
|---|---|---|---|
| heat treatment (1) | 70 | 0 | — |
| | (70) | (70) | (10) |
| heat treatment (2) | 70 | 0 | — |
| | (70) | (20) | (5) |
| heat treatment (3) | 70 | 0 | — |
| | (70) | (6) | (1) |

( ) designates the prior.

TABLE 4

| | |
|---|---|
| heat treatment (1) (rate: degree/min) | insert→800° C.→1000° C.→1100° C. |
| | 10    6 |
| | →1250° C.→1100° C.→800° C. |
| | 3    3    5 |
| | →discharge |
| heat treatment (2) (rate: degree/min) | insert→800° C.→1000° C.→1100° C. |
| | 10    3 |
| | →1250° C.→1100° C.→800° C. |
| | 2    2    3 |
| | →discharge |
| heat treatment (3) (rate: degree/min) | insert→800° C.→1000° C.→1100° C. |
| | 5    2 |
| | →1250° C.→1100° C.→800° C. |
| | 1    1    3 |
| | →discharge |

*The heat treatment was performed with an atmosphere of $N_2 + O_2$

What is claimed is:

1. A vertical boat for supporting a plurality of semiconductor wafers, each wafer having a peripheral portion and an inner portion therearound, the boat having a top portion and a bottom portion, comprising:
   two end members placed at the top portion and the bottom portion of the vertical boat; and
   a plurality of support members vertically extending between the end members for supporting the wafers,
   each of the support members being a plate-like member having a series of slits formed at a predetermined interval thereon,
   a plurality of support arms being defined by the slits, the support arms having support projections in such a manner that the inner portion of the wafer contacts and is supported by the support projections whereas the peripheral portion of the wafer does not contact the support projections and the arms of the support members wherein
   the inner portion of the wafer to be supported by the support projections ranges from a center of the wafer by 50%–90% of the radius of the wafer,
   the vertical boat is made of a material selected from a group consisting of silica glass, silicon carbide, carbon, monocrystal silicon, polycrystal silicon, and silicon carbide impregnated with silicon, and
   the support arms and the support projections of the support members are integral with each other so as to constitute a monoblock body.

2. A vertical boat according to claim 1, wherein the inner portion of the wafer to be supported by the support projections ranges from a center of the wafer by 65%–85% of the radius of the wafer.

3. A vertical boat according to claim 1, wherein the inner portion of the wafer to be supported by the support projections is positioned about a center of the wafer.

4. A vertical boat according to claim 1, wherein the slits extend over ⅔ or more of the width of the plate-like member.

5. A vertical boat according to claim 1, wherein the slits extend over ¾ or more of the width of the plate-like member.

6. A vertical boat according to claim 1, wherein the slits extend over ⅘ or more of the width of the plate-like member.

7. A vertical boat according to claim 1, wherein the support members include two front support members and two rear support members, the four support members being symmetrical with respect to a plane including a central axis of the vertical boat and parallel to a wafer inserting direction.

8. A vertical boat according to claim 7, wherein the inner portion of the wafer to be supported by the support projections is arranged in a circumferential direction in such a manner that an angle formed by the wafer inserting direction and a line linking the support projection of the rear support member to the center of the wafer is 75–180 degrees, and that an angle formed by the wafer inserting direction and a line linking the support projection of the front support member to a center of the wafer is 30–120 degrees.

9. A vertical boat according to claim 7, wherein the inner portion of the wafer to be supported by the support projections is arranged in a circumferential direction in such a manner that an angle formed between the wafer inserting direction and a line linking the support projection of the rear support member to the center of the wafer is 95–140 degrees, and that an angle formed between the wafer inserting direction and a line linking the support projection of the front support member to a center of the wafer is 30–80 degrees.

10. A vertical boat according to claim 7, wherein the inner portion of the wafer to be supported by the support projections is symmetrical with respect to a plane including a central axis of the vertical boat and perpendicular to a wafer inserting direction.

11. A vertical boat according to claim 1, wherein a section modulus of the support member is 0.3–3.0 cubic centimeters.

12. A vertical boat according to claim 11, wherein a section modulus of the support member is 0.5–2.5 cubic centimeters.

13. A method for producing a vertical boat according to claim 1 comprising the steps of:
   forming a series of first slit portions on a plate-like member at a predetermined interval along a longitudinal direction thereof so that two side walls of the plate-like member remain; and
   forming a series of second small slit portions on one of the side walls at the same interval so as to connect each second slit portion to the corresponding first slit portion.

14. A method according to claim 13, wherein the second slit portions are formed by a diamond cutter.

15. A method according to claim 13, wherein after said forming of the first slit portions, the plate-like members are mounted on one or two end members, and the second slit portions are formed thereafter.

16. A method according to claim 13, wherein after said forming of the first slit portions, the plate-like members are impregnated with Si, and the second slit portions are formed thereafter.

17. A vertical boat for supporting a plurality of semiconductor wafers, each wafer having a peripheral portion and an inner portion therearound, the boat having a top portion and a bottom portion, comprising:
   two end members placed at the top portion and the bottom portion of the vertical boat; and a plurality of support members vertically extending between the end members for supporting the wafers, each of the support members being a plate-like member having a series of slits integrally formed at a predetermined interval thereon, a plurality of support arms being defined by the slits, the support arms having support projections in such a manner that the inner portion of the wafer contacts and is supported by the support projections whereas the peripheral portion of the wafer does not contact the support projections and the arms of the support members.

18. A vertical boat according to claim 17, wherein the inner portion of the wafer to be supported by the support projections ranges from a center of the wafer by 50%–90% of the radius of the wafer, the vertical boat is made of a material selected from a group consisting of silica glass, silicon carbide, carbon, monocrystal silicon, polycrystal silicon, and silicon carbide impregnated with silicon, and the support arms and the support projections of the support members are integral with each other so as to constitute a monoblock body.

* * * * *